United States Patent
Doerr et al.

(10) Patent No.: US 11,294,061 B1
(45) Date of Patent: Apr. 5, 2022

(54) LIDAR SENSOR WITH ORTHOGONAL ARRAYS

(71) Applicant: Acacia Communications, Inc., Maynard, MA (US)

(72) Inventors: Christopher Doerr, Middletown, NJ (US); Long Chen, Marlboro, NJ (US)

(73) Assignee: Acacia Communications, Inc., Maynard, MA (US)

( * ) Notice: Subject to any disclaimer, the term of this patent is extended or adjusted under 35 U.S.C. 154(b) by 16 days.

(21) Appl. No.: 16/104,872

(22) Filed: Aug. 17, 2018

Related U.S. Application Data

(60) Provisional application No. 62/547,714, filed on Aug. 18, 2017.

(51) Int. Cl.
| | | |
|---|---|---|
| *G01S 17/89* | (2020.01) | |
| *G01S 7/481* | (2006.01) | |
| *G01S 17/10* | (2020.01) | |
| *G01S 17/42* | (2006.01) | |
| *H01S 5/00* | (2006.01) | |

(52) U.S. Cl.
CPC ............ *G01S 17/89* (2013.01); *G01S 7/4811* (2013.01); *G01S 7/4817* (2013.01); *G01S 17/10* (2013.01); *G01S 17/42* (2013.01); *H01S 5/0071* (2013.01)

(58) Field of Classification Search
CPC ....... G01S 7/4811; G01S 7/4817; G01S 17/89
See application file for complete search history.

(56) References Cited

U.S. PATENT DOCUMENTS

| | | | | |
|---|---|---|---|---|
| 6,351,247 | B1* | 2/2002 | Linstrom | H01Q 3/46 342/368 |
| 9,369,213 | B1* | 6/2016 | Kakande | H04B 10/6166 |
| 10,627,517 | B2* | 4/2020 | Yaacobi | G01S 17/931 |
| 2006/0081764 | A1* | 4/2006 | Lee | G01S 13/89 250/208.1 |
| 2010/0141527 | A1* | 6/2010 | Lalezari | H01Q 21/24 342/368 |
| 2016/0049765 | A1 | 2/2016 | Eldada | |
| 2016/0139266 | A1* | 5/2016 | Montoya | G01S 17/32 356/5.01 |
| 2017/0234984 | A1* | 8/2017 | Khial | G01S 7/486 356/5.1 |
| 2017/0350964 | A1* | 12/2017 | Kaneda | G01S 17/58 |
| 2017/0371227 | A1* | 12/2017 | Skirlo | G02F 1/3136 |
| 2018/0120422 | A1* | 5/2018 | Fujita | G02F 1/2955 |

(Continued)

OTHER PUBLICATIONS

Doerr, et al., "O , E, S, C, and L Band Silicon Photonics Coherent Modulator/Receiver," in OFC, 2016, pp. 8-10.

(Continued)

*Primary Examiner* — Michael A Lyons
(74) *Attorney, Agent, or Firm* — Joseph D'Angelo

(57) ABSTRACT

An apparatus for scanning a scene comprising a light transmitter including a one-dimensional phased array; wherein the light transmitter is fed by a frequency swept scanning laser; and a light receiver including a one-dimensional phased array; the one-dimensional phased array of the light receiver disposed orthogonally to the one-dimensional phased array of the transmitter; wherein light received by the light receiver is enabled to be interfered with light from the frequency swept scanning laser.

9 Claims, 7 Drawing Sheets

(56) References Cited

U.S. PATENT DOCUMENTS

2018/0306925 A1* 10/2018 Hosseini ................ G01S 17/42

OTHER PUBLICATIONS

Doylend, et al., "Hybrid III/V Silicon Photonic Source with Integrate 1D free-space Beam Steering," Opt. Lett. vol. 37, No. 20, 2012, pp. 4257-4259.
Poulton, et al., "Frequency-modulated Continuous-wave LIDAR Module in Silicon Photonics," in OFC, No. c, 2016, pp. 4-6.
Sun, et al., "Large-Scale Integrated Silicon Photonic Circuits for Optical Phased Arrays," in Adv. Photonics Commun., vol. 1, No. c, 2014, pp. 9-11.

* cited by examiner

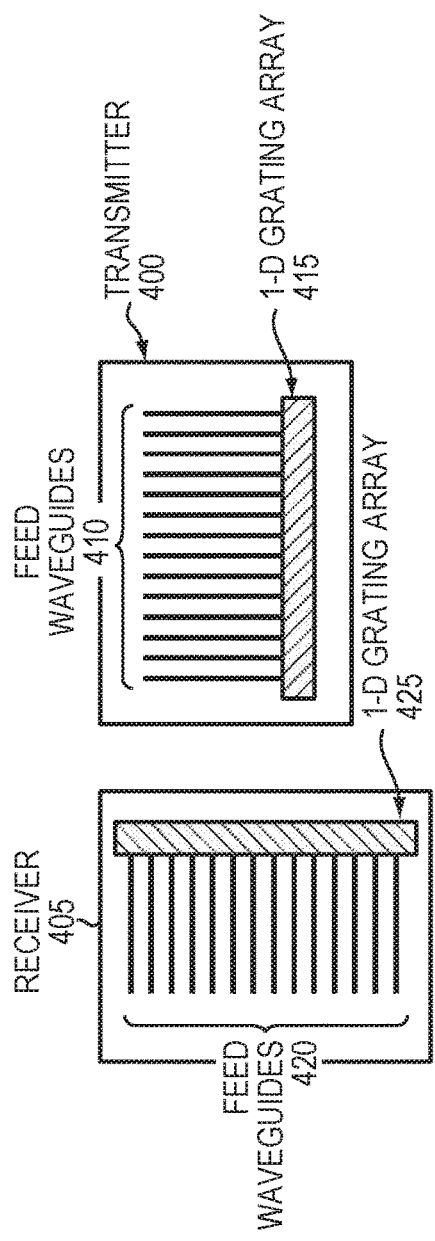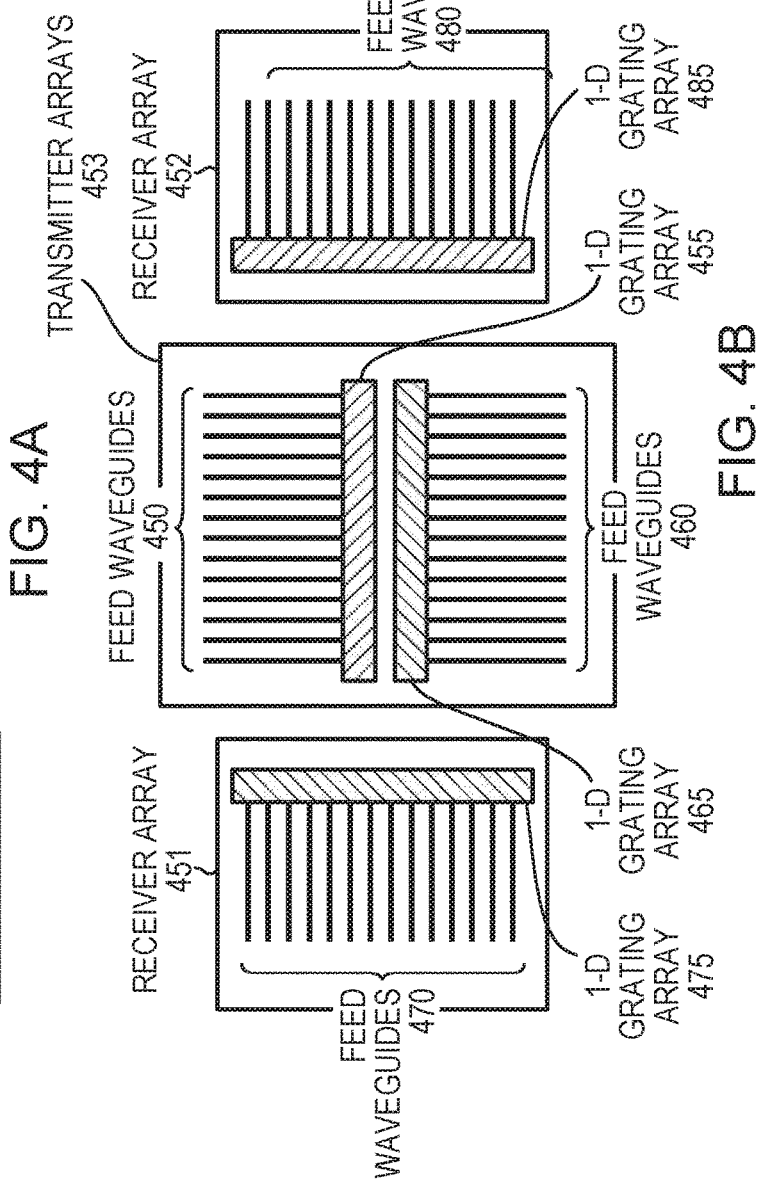
FIG. 4A
FIG. 4B

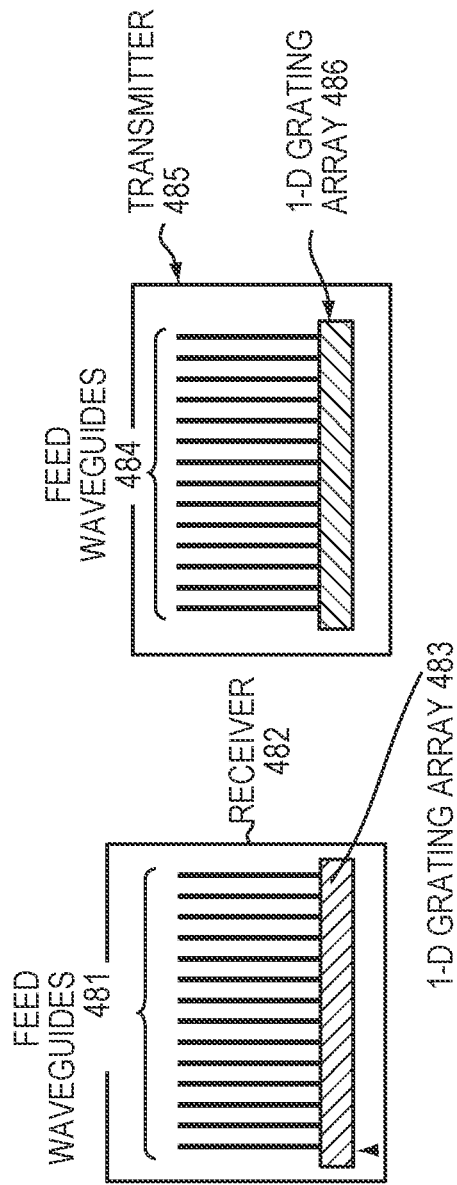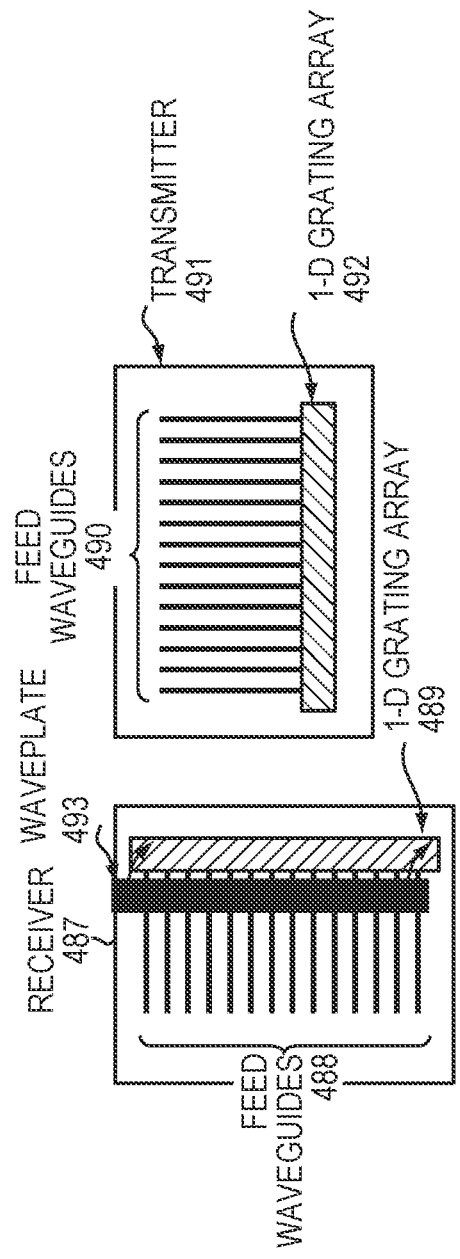
FIG. 4C
FIG. 4D

LIDAR SENSOR WITH ORTHOGONAL ARRAYS

RELATED APPLICATIONS

The present application claims the benefit under 35 U.S.C. § 119(e) of U.S. Patent Application Ser. No. 62/547,714 filed Aug. 18, 2017 and entitled "STEERING A BEAM WITH A GRATING," which is hereby incorporated herein by reference in its entirety. This present application is also related to U.S. patent application Ser. No. 16/104,866 filed on Aug. 17, 2018 and entitled "A METHOD, SYSTEM, AND APPARATUS FOR A LIDAR SENSOR WITH A LARGE GRATING," and patent application Ser. No. 16/104,869 filed on Aug. 17, 2018 and entitled "METHOD, APPARATUS, AND SYSTEM FOR LIDAR SENSOR WITH VARYING GRATING PITCH," which are both hereby incorporated herein by reference in their entirety.

BACKGROUND

Scanning systems often transmit a signal and measure a reflection of the signal at a receiver.

BRIEF DESCRIPTION OF THE FIGURES

Various aspects and embodiments of the application will be described with reference to the following example embodiments. It should be appreciated that the figures are not necessarily drawn to scale.

FIG. 4a is a simplified illustration of a transmitter array and a receiver array, in accordance with an embodiment of the present disclosure;

FIG. 4b is a simplified illustration of two transmitter arrays and two receiver arrays, in accordance with an embodiment of the present disclosure;

FIG. 4c is an alternative simplified illustration of two transmitter arrays and two receiver arrays, in accordance with an embodiment of the present disclosure;

FIG. 4d is a further simplified illustration of two transmitter arrays and two receiver arrays with a waveplate, in accordance with an embodiment of the present disclosure;

SUMMARY

Figure 1:
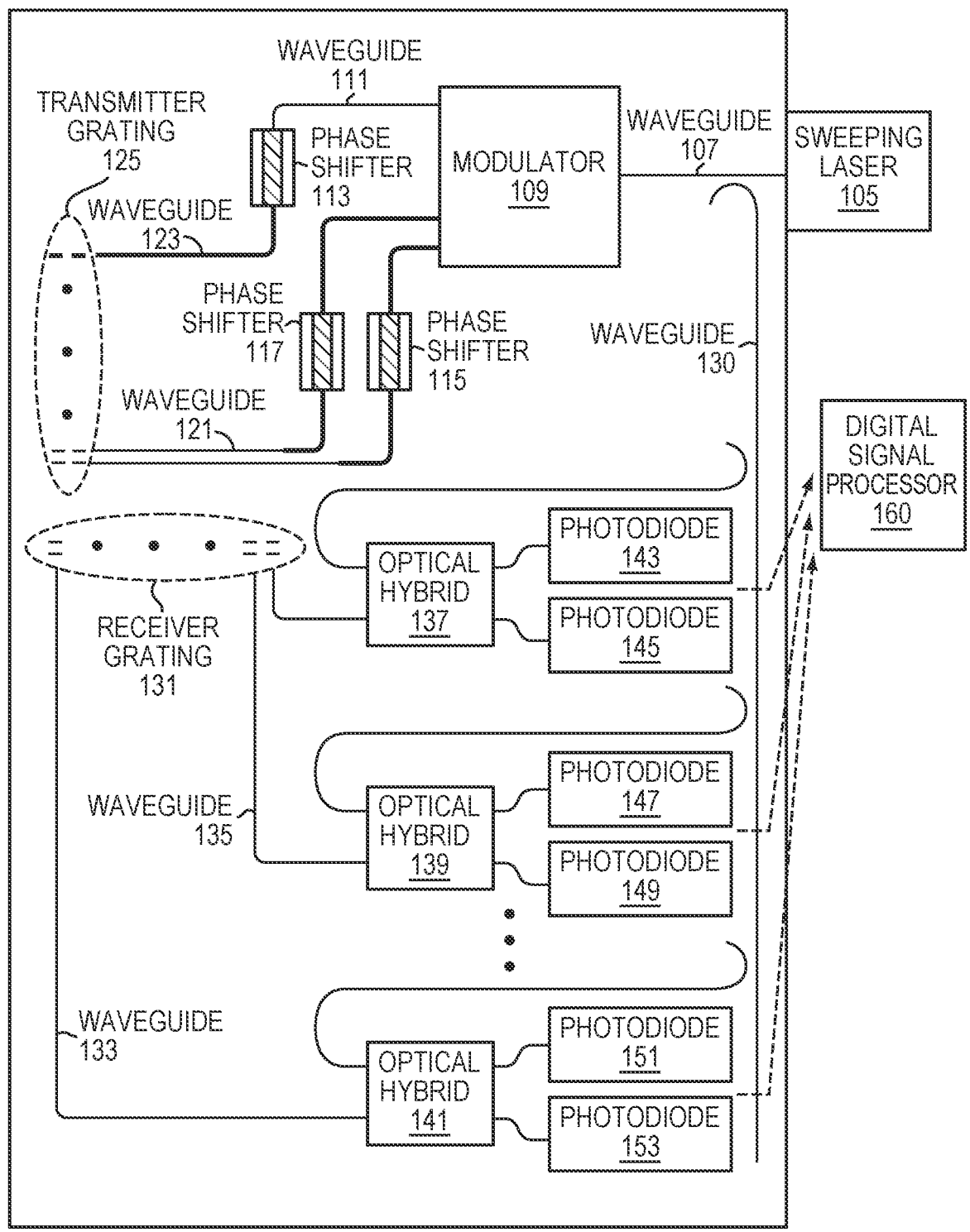
FIG. 1 is a simplified illustration of an optical scanning system with a transmitter and receiver using an array of phase shifters to steer a transmitter beam, in accordance with an embodiment of the present disclosure.

A method and apparatus for scanning a scene.

DETAILED DESCRIPTION

Generally, a LiDAR scanning system may be used to capture a 3D image of a scene. Typically, there may be a transmitter (Tx) that projects light and a receiver (Rx) that receives the reflection of the light. In conventional systems, a Tx scans a beam in 2D using a moveable mirror. Generally, a moveable mirror is expensive, and prone to reliability issues, cannot sweep very fast, and requires high voltages. In many embodiments, the current disclosure has recognized that there may be benefits to "solid state" scanning that eliminates a moveable mirror. Note that in the marketplace, some LiDAR systems with MEMS moveable mirrors are called "solid state." In many embodiments herein, the use of "solid state" herein, implies no moving parts.

The current disclosure has recognized that conventional 2D solid state solutions, such as a 2D phased array of gratings, may be complex and difficult to scale because of the requirement for a large number of controllable elements such as a 2D phased array of gratings. Typically, a 2D solid state scanner may use controllable elements to steer in one direction and laser wavelength tuning to steer in another direction. In many embodiments, the current disclosure recognizes that if wavelength tuning is used to steer direction, using wavelength to measure depth is limited or not possible. Also, using wavelength to steer typically requires a large tuning range from the laser, which makes the laser about 10 times more expensive.

In some embodiments, a 1D scanner may be simpler to make and may be scalable to a large scanning range and high resolution. In some embodiments, a 1D scanner may use a MEMS mirror scanning in one dimension for the Tx and a lens and receiver array for the Rx, where the Rx array is orthogonal to the Tx scanning direction. In another embodiment, a 1D scanner may use an array of 1D phased arrays, pointing at different angles in an orthogonal direction to the steering, in order to create 2D scanning.

Typically, scanning performed in 1D is performed with pulsed or modulated light and direct detection to determine distance. Generally, direct detection is used to detect reflected light. In many embodiments, the current disclosure has realized that direct detection may result in a limited resolution of a scan. In most embodiments, the current disclosure has realized that direct detection may be able to measure one photon at a time, with a single photon APD (SPAPD), which may limit detection if multiple photons are reflected from a given point due to the recovery time of the SPAPD.

In almost all embodiments, the current disclosure has realized that typical systems that use non-coherent light may not function well with partial reflections. In certain embodiments, the current disclosure has recognized that typical direct detect systems may not work well with trees where there may be partial reflections. In other embodiments, the current disclosure has realized that direct detect systems may be sensitive to interference from transmission from other direct detect systems.

In certain embodiments, the current disclosure may enable using coherent light with a one dimensional array to perform scanning of a scene. In many embodiments, the current disclosures may enable using one dimensional scanning to realize a three-dimensional image. In some embodiments, the current disclosures may enable using one dimensional scanning to realize a four-dimensional image, where the fourth dimension indicates motion. In certain embodiments, the current disclosure may enable a point spread of a three-dimensional scene. In some embodiments, a point spread of a scene may be called a point cloud.

In certain embodiments, the current disclosure may use coherent light to create a point cloud of a scene. In many embodiments, use of coherent light may enable a resolution around 100 times better than using a direct detect system. In some embodiments, a coherent detection system may offer a distance resolution of microns. In other embodiments, use of coherent light may offer tens of centimeters of distance. In certain embodiments, coherent light may refer to light of a similar or uniform wavelength and phase, such as that produced by a laser. In some embodiments, incoherent light may refer to light that has different phases or waves such as light produced by a lightbulb.

In most embodiments, use of coherent light may be resilient against interference of other light sources. In many embodiments, a coherent light scanning system may filter out light other than the frequency of a coherent light scan. In certain embodiments, a coherent scanning system may not receive interference from other light sources from another coherent scanning system unless the laser sweeps of the systems are synchronized. In many embodiments, a coherent system may be able to enable four-dimensional scanning, location plus movement, by measuring a Doppler shift or upshift in the frequency of the received light.

In certain embodiments, the current disclosure may enable a LiDAR sensor that uses orthogonal 1D transmitter and receiver arrays and wavelength sweeping to create a 3D image. In many embodiments, a transmitter array may project light using an array of phase shifters and short surface-emitting gratings. In many embodiments, a phased array may mean optical emitters or receivers with a controllable phase for each element. In most embodiments, a phased shifter may be an optical element that can adjust phase of light. In certain embodiments, a grating may be an optical element with periodic spaced scattering elements.

In most embodiments, the current disclosure may use an array of coherent receivers to detect light from a transmitter. In many embodiments, a coherent receiver may be able to measure phase and thus may be able to determine direction of a 1-direction beam. In most embodiments, by analyzing speed of interference fringes in relation to a sweeping speed of a laser, a distance may be calculated.

In many embodiments, the current disclosure may enable two orthogonal 1D phased arrays, one acting as a Tx and the other as an Rx. In some embodiments, a Tx may be steered using controllable elements. In many embodiments, a Rx may be an array of coherent receivers. In some embodiments, a coherent receiver may measure phase and may distinguish from which direction, in 1D, the beam is coming. In many embodiments, input to the Tx may be a frequency-swept laser, and part may be split off to act as a local oscillator for the coherent receiver array. In certain embodiments, by analyzing the speed of the interference fringes in relation to the sweeping speed of the laser, the distance may be calculated. In many embodiments, the current disclosure has realized that conventional systems typically use direct detection and thus cannot use a phased array for the Rx.

Refer now to the example embodiment of FIG. 1. In the example embodiment of FIG. 1, frequency-swept laser 105 feeds light to a transmitter through waveguide 107. The transmitter is fed by waveguide 107 into modulator 109, which modulates the light, and transmits the light through waveguides, such as waveguide 111 to phase shifters, such as phase shifter 113, phase shifter 115, and phase shifter 117. Phase shifters 113, 115, and 117, shift the phase of the light and transmit the light to transmitter grating through waveguides, such as waveguide 121 and 123. Light flows through transmitter grating array 125 and illuminates a portion of a scene. In this embodiment, transmitter is a one dimensional transmitter. The transmitter consists of an array of phase shifters and short surface-emitting gratings. FIG. 1 has waveguide 130.

Laser 105 also feeds a local oscillator of a receiver. The receiver includes receiver grating array 131, which feeds received light through waveguides, such as waveguides 133 and 135 to optical hybrids, such as optical hybrids 137, 139, and 141. Optical hybrid 137 feeds photodiodes 143 and 145, optical hybrid 139 feeds photodiode 147 and 149, and optical hybrid 141 feeds photodiode 151 and 153. In this embodiment, receiver grating array 131 is orthogonal to transmitter grating array 125. In the example embodiment of FIG. 1, optical hybrids 137, 139, and 141 are 180° hybrids. The output of the photodiodes 143, 145, 147, 149, 151, 153, is fed, directly or indirectly, into Digital Signal Processor (DSP) 160.

In some embodiments, 90° hybrids instead of 180° hybrids may be used in a receiver. In many embodiments, hybrids maybe connected to photodiode pairs. In another embodiment, one photodetector per hybrid may be used in a receiver. In certain embodiments, photodiodes in each pair may be subtracted in a differential amplifier, and the resulting difference may be digitized in an analog-to-digital converter, which may be fed into a digital signal processor (DSP).

In some embodiments, a DSP may recover magnitude and phase of the light received by each surface grating. In most embodiments, by measuring a frequency of fringes of interference from a scanned object as a laser wavelength tunes, a DSP may determine distance to (i.e., depth information of) the reflection point of the scanned object.

In many embodiments, the transmitter and receiver may be part of a photonic integrated circuit (PIC). In some embodiments, a transmitter and receiver may be on the same die or separate die. In certain embodiments, a PIC may be made in silicon photonics. In most embodiments, silicon photonics may permit high-contrast gratings, efficient phase shifters, compact waveguide circuits, and integrated photodiodes.

In many embodiments, phased array emitters may be short gratings. In certain embodiments, a receiver may need to receive the same polarization as emitted by a transmitter. In a particular embodiment, a half-wave plate may be placed over either a transmitter or receiver array to rotate the polarization. In another embodiment, there may be orthogonal polarizations in transmitter and receiver waveguides, e.g., TE polarization in the transmitter waveguides and TM polarization in the receiver waveguides. In certain embodiments, polarization rotators and grating designs may be used. In other embodiments, waveguides of a transmitter grating and a receiver grating may be bent so the polarization of the received light is the same as the polarization of the transmitted light, such as shown in FIG. 2.

Figure 2:
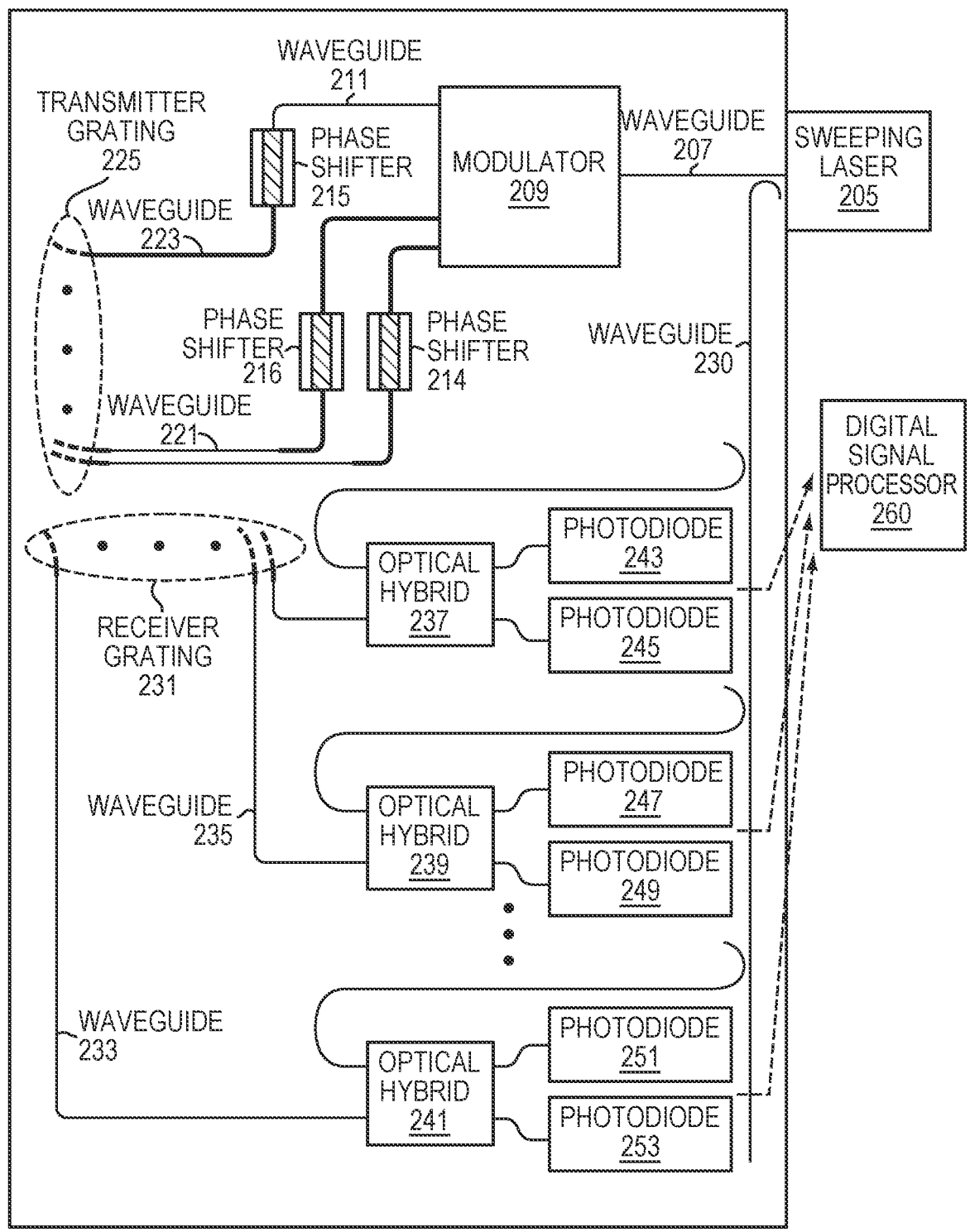
FIG. 2 is an alternative simplified illustration of an optical scanning system with a transmitter and receiver in which gratings of a transmitter and receiver have a same orientation, in accordance with an embodiment of the present disclosure.

In the example embodiment of FIG. 2, frequency-swept laser 205 feeds light to a transmitter through waveguide 207. The transmitter is fed by waveguide 207 into modulator 209, which modulates the light, and transmits the light through waveguides, such as waveguide 211 to phase shifters, such as phase shifter 214, phase shifter 215, and phase shifter 216. Phase shifters 214, 215, and 216 shift the phase of the light and transmit the light to transmitter grating through waveguides, such as waveguide 221 and 223. In this embodiment, the transmitter is a one dimensional transmitter. The transmitter consists of an array of phase shifters and short surface-emitting gratings. FIG. 2 has waveguide 230.

Laser 205 also feeds a local oscillator of a receiver. The receiver includes receiver grating array 231, which feeds received light through waveguides, such as waveguides 233 and 235 to optical hybrids, such as optical hybrids 237, 239, and 241. Optical hybrid 237 feeds photodiodes 243 and 245, optical hybrid 239 feeds photodiode 247 and 249, and optical hybrid 241 feeds photodiode 251 and 253. In the example embodiment of FIG. 2, optical hybrids 237, 239, and 241 are 180° hybrids. The output of the photodiodes 243, 245, 247, 249, 251, 253, is fed, directly or indirectly, into Digital Signal Processor (DSP) 260.

Refer now to the example embodiment of FIG. 2. The example embodiment of FIG. 2 is similar to that of FIG. 1, however in the example embodiment of FIG. 2, waveguides of transmitter grating 225 and waveguides of receiver grating 231 are bent by 45 degrees before the gratings so that the gratings have the same orientation. In the example embodiment of FIG. 2, bending the waveguides ensures that the receiver receives the same polarization of light as transmitted by the receiver.

Figure 3:
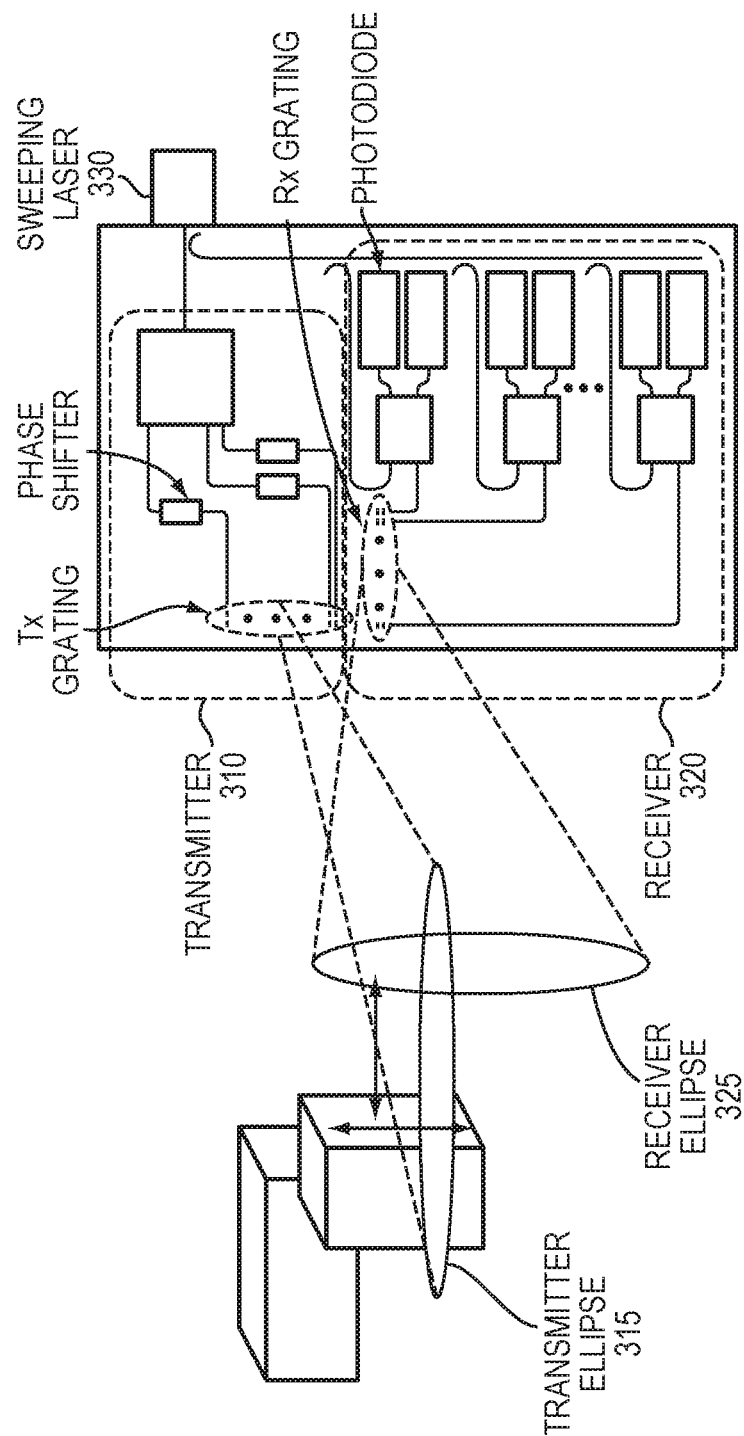
FIG. 3 is a simplified illustration of optical scanning using an optical scanning system, in accordance with an embodiment of the present disclosure.

Refer now to the example embodiment of FIG. 3, which illustrates schematic of a scanning area and receiver area. In the example embodiment of FIG. 3, light from transmitter 310 has an elliptical far-field pattern 315, which can be steered side-to-side by adjusting phase shifters of Transmitter 310. Light transmitted by transmitter 310 to ellipse 315 reflects off objects in the scene and falls on receiver 320. Receiver 320 receives light from ellipse 325 in the far field that scans in an orthogonal direction to transmitter ellipse 315. With transmitter 310 scanning in one lateral dimension, receiver 320 scanning in a second lateral dimension, and laser 330 scanning depth, a 3-D image can be captured. Note, in the example embodiment of FIG. 3 that the receiver is not scanning. In the example embodiment of FIG. 3, the receiver is receiving light simultaneously from all directions, and the coherent signal processing determines where the light comes from in the Rx "scanning" direction by examining the relative phases of the received light between waveguides. In other embodiments, the Tx and Rx may each be rotated 90 degrees.

In some embodiments, received power may be a fraction of the transmitted power. In particular embodiments, excess loss may be approximately equal to a resolution of scanning by the Tx. In the example embodiment of FIG. 3, excess loss may be equal to the resolution of scanning in the vertical direction.

Refer now to the example embodiment of FIG. 4a, which illustrates a top-die-view general configuration of a transmitter and receiver grating. In FIG. 4a, a one-dimensional transmitter 400 array includes feed waveguides 410 and 1-D grating 415. Orthogonal 1-D receiver array 405 has feed waveguides 420 and one-dimensional grating 425. In this example embodiment, transmitter grating 400 and receiver grating 405 are located on a single PIC.

In FIG. 4b, there are multiple transmitter/receiver sets on the same PIC or PIC package, to improve light collection efficiency, improve scanning time, and/or improve signal-to-noise ratio. In FIG. 4b, there are two transmitter arrays 453 and two receiver arrays, 451 and 452. In the example embodiment of FIG. 4b, the designation of transmitter array and receiver array may be changed so that a different array is a receiver array and a different array is a transmitter array.

Refer now to the example embodiment of FIG. 4c, which illustrates a top-die-view general configuration of a transmitter and receiver grating. In FIG. 4c, a one-dimensional transmitter 485 array includes feed waveguides 484 and 1-D grating 486. Parallel 1-D receiver array 482 has feed waveguides 481 and one-dimensional grating 483. In this example embodiment, transmitter grating 485 and receiver grating 482 are located on a single PIC. In an embodiment, the light transmitter and light receiver gratings are parallel to each other.

Refer now to the example embodiment of FIG. 4d, which illustrates a top-die-view general configuration of a transmitter and receiver grating. In FIG. 4d, a one-dimensional transmitter 491 array includes feed waveguides 490 and 1-D grating 492. Orthogonal 1-D receiver array 487 has feed waveguides 488 and one-dimensional grating 489. In this example embodiment, transmitter grating 492 and receiver grating 489 are located on a single PIC. Waveplate 493 rotates polarization of the light receiver. In an embodiment, wherein the light transmitter and light receiver gratings are oriented orthogonal to each other, there is a waveplate to rotate the polarization of the light transmitter. In an embodiment, wherein the light transmitter and light receiver gratings are oriented orthogonal to each other, there is a waveplate to rotate the polarization of the light receiver.

Figure 5:
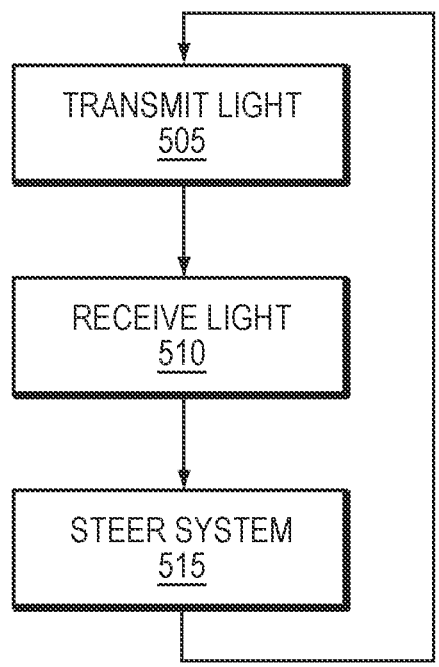
FIG. 5 is a simplified method for creating an optical scan, in accordance with an embodiment of the present disclosure.

Refer now to the example embodiment of FIG. 5, which illustrates a sample method for scanning a scene. A transmitter, such as for example one of FIGS. 1-4, transmits light (step 505). A receiver, such as for example, a receiver of FIGS. 1-4, receives the reflection of the transmitted light (step 510). The system is steered to capture another portion of the scene (step 515). In most embodiments, steering the system may include changing where the transmitter is projecting light and where the receiver is expecting to find reflected light.

Figure 6:
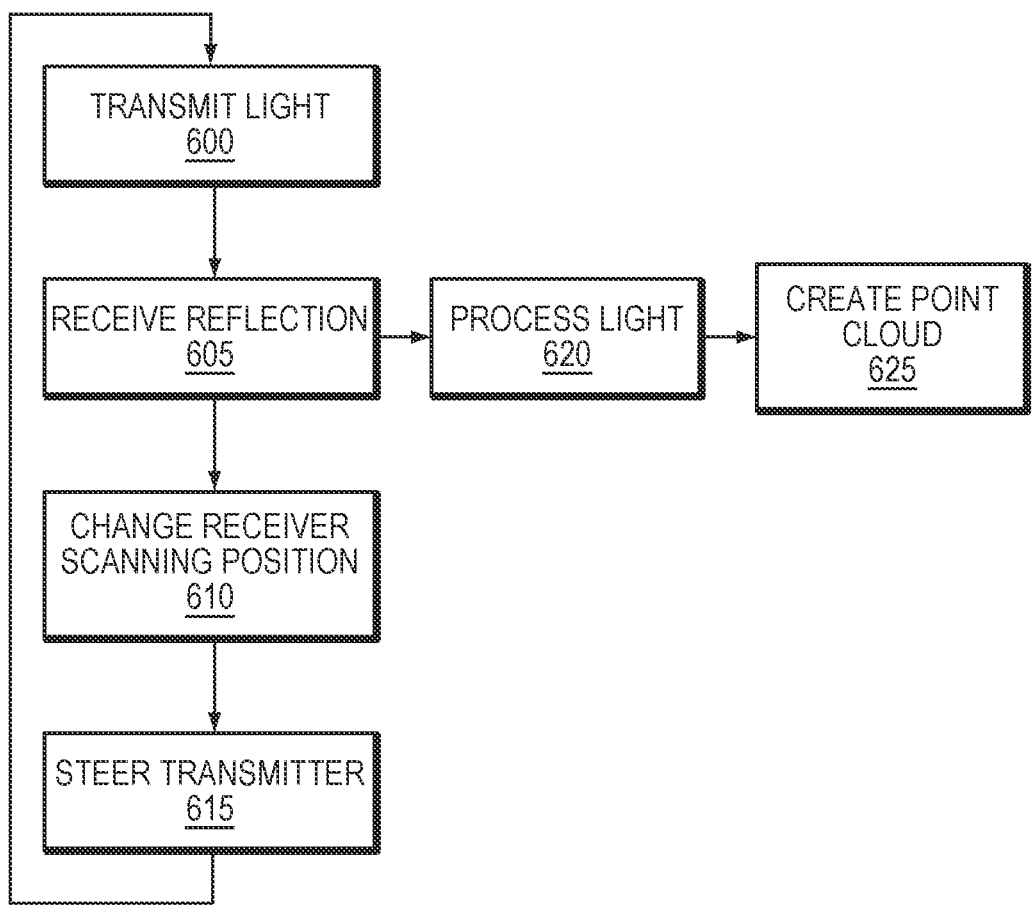
FIG. 6 is an alternative simplified method for creating an optical scan, in accordance with an embodiment of the present disclosure.

Refer now to the example embodiment of FIG. 6, which illustrates a sample method for creating a point cloud. Light is transmitted or projected by a transmitter, such as for example of that of FIGS. 1-4 (step 600). A receiver, such as for example, a receiver of FIGS. 1-4, receives the reflection of the transmitted light (step 610). The location the receiver is expecting to receive light is changed (Step 610). The transmitter is steered (step 615) and steps 600-615 are iterated to scan a scene. Light received from the reflection is processed by a digital signal processor, such as for example the DSP of FIG. 1 or 2 (step 620). A point cloud is created (step 625). In certain embodiments, a DSP may control the steering of the scanning system. In many embodiments, a DSP may be able to determine motion of an object by measuring the Doppler effect for a received point. In some embodiments, a DSP may be able to determine whether a point received is a liquid by measuring a Doppler effect for a received point.

Figure 7:
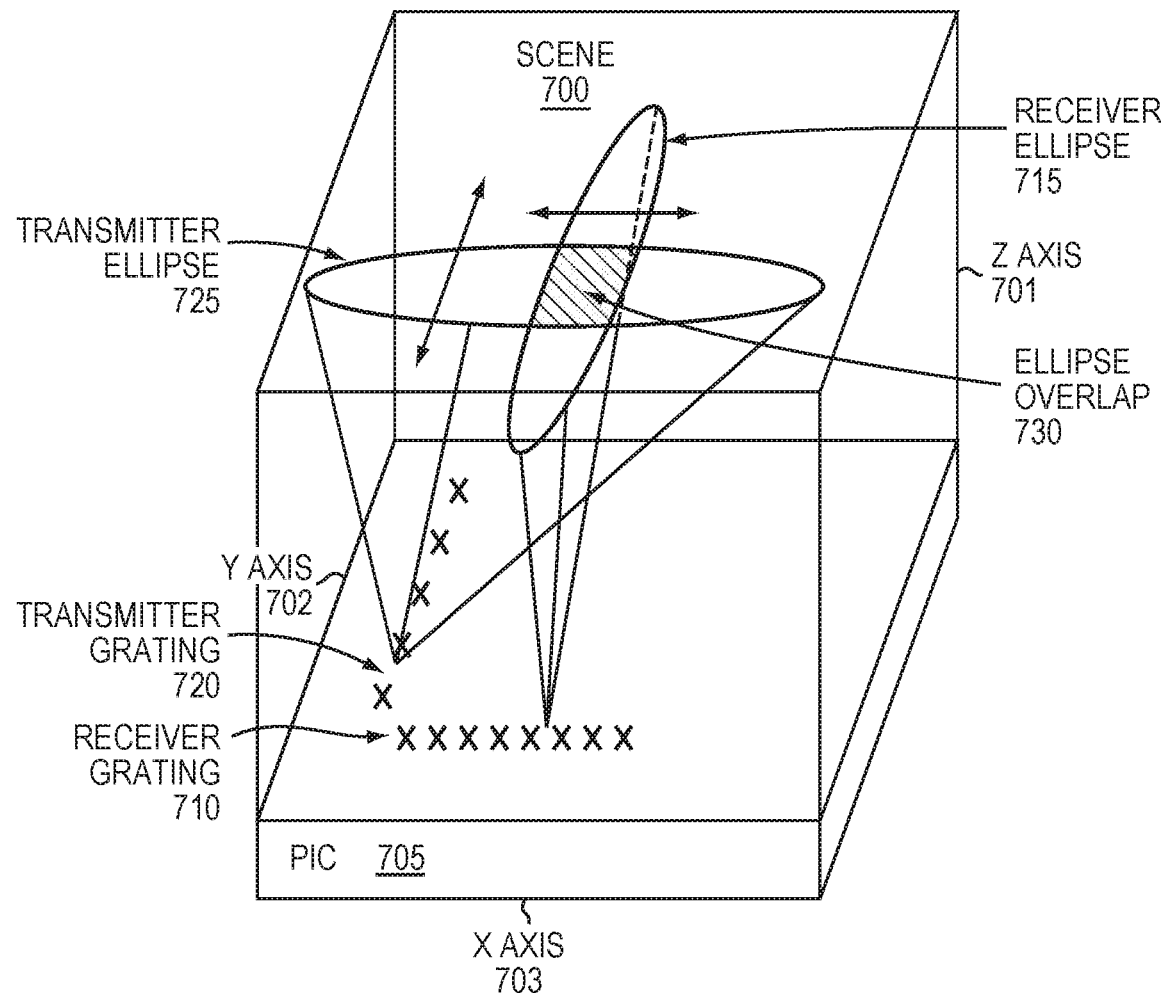
FIG. 7 is a simplified illustration of optical scanning using an optical scanning system showing scanning ellipses in a 3 dimensional scene, in accordance with an embodiment of the present disclosure.

Refer now to the example embodiment of FIG. 7, which illustrates an optical scanning system showing scanning ellipses in a 3 dimensional scene. In the example embodiment of FIG. 7, scene 700 is a three dimensional scene. Scene 700 is demarked by z axis 701, y axis 702, and x axis 703. PIC 705 is aligned as a plane across x axis 703. PIC 710 has transmitter grating 720. Transmitter grating 720 illuminates transmitter ellipse 725 in scene 700. PIC 705 has receiver grating 710 which receives light from area shown as receiver ellipse 715. Ellipse overlap 730 is where transmitter ellipse 725 and receiver ellipse 715 overlap and denotes the portion of reflected light from transmitter grating 720 that receiver grating 710 receives and processes.

In many embodiments, techniques of the current disclosure may require no moving parts (not even a MEMS mirror), may be very compact, and may be scalable to very high-resolution scans. In certain embodiments, there may be a relatively low collection efficiency by the receiver, because the ellipse of the receiver is orthogonal to that of the transmitter. In most embodiments, collection efficiency may be irrelevant as the light transmitted is outside of a range that can impact human vision. In many embodiments, the power of the light used may not be a safety concern as it may be outside the range of light that is harmful to human vision. In some embodiments, the wavelength of the light may be in the range of 1550 nm. In certain embodiments, an ellipse transmission are may lower the power of light such that it is not harmful to human vision.

In many embodiments, one or more of the current techniques may be performed on a Digital Signal Processing (DSP) of a receiver. In most embodiments, the output of a scanning system may be sent to a DSP. In certain embodiments, a DSP may process the captured light to determine a point cloud. In many embodiments, a DSP may be a custom designed ASIC chip in order to process measured light quickly and power efficiently. In most embodiments, a DSP may be able to determine change in the wavelength of reflected light. In many embodiments, a DSP may be able to detect change of phase of reflected light. In certain embodiments, a DSP may be able to detect other changes in the reflected light. In almost all embodiments, a DSP may be able to determine distance by looking at changes in reflected light. In many embodiments, a DSP may be able to determine location within three dimensions by looking at reflected light.

In some embodiments, one or more of the techniques described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor.

In most embodiments, a processor may be a physical or virtual processor. In other embodiments, a virtual processor may be spread across one or more portions of one or more physical processors. In certain embodiments, one or more of the techniques or embodiments described herein may be embodied in hardware such as a Digital Signal Processor DSP. In certain embodiments, one or more of the embodiments herein may be executed on a DSP. One or more of the techniques herein may be programed into a DSP. One or more of the techniques herein may be fabricated in a DSP. In some embodiments, a DSP may have one or more processors and one or more memories. In certain embodiments, a DSP may have one or more computer readable storages. In other embodiments, one or more of the embodiments stored on a computer readable medium may be loaded into a processor and executed.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. An apparatus for scanning a scene comprising:
a coherent light transmitter including a transmitter one-dimensional phased array; wherein the coherent light transmitter is fed by a frequency swept scanning laser;
a coherent light receiver including a receiver one-dimensional array; and
an array of optical hybrids; an array of photodetectors; the receiver one-dimensional array disposed orthogonally to the transmitter one-dimensional phased array; wherein light received by the coherent light receiver is enabled to be interfered with light from the frequency swept scanning laser in the array of optical hybrids by interfering light received individually in each element of the receiver one-dimensional array with light split off from the frequency swept scanning laser; wherein each individually interfered light is sent to at least a respective photodiode of the array of photodetectors.

2. The apparatus of claim 1 wherein the phased array of the coherent light transmitter further includes surface emitting gratings; wherein the phased array of the coherent light receiver further consists of surface emitting gratings.

3. The apparatus of claim 2 wherein each photodetector of the array of photodetectors is a photodiode; array wherein each optical hybrid of the array of optical hybrids has a balanced photodiode pair.

4. The apparatus of claim 1 wherein the one-dimensional phased array of the coherent light transmitter is a phased array of phase shifters.

5. The apparatus of claim 1 wherein measurements of light received by the coherent light receiver are sent to a digital signal processor (DSP); wherein the DSP generates a point cloud of a scene from which the light reflected.

6. The apparatus of claim 1 wherein the coherent light transmitter and the coherent light receiver are on the same photonic integrated circuit.

7. The apparatus of claim 1 wherein the coherent light transmitter and the coherent light receiver employ gratings.

8. The apparatus of claim 7 wherein the coherent light transmitter and coherent light receiver gratings are oriented orthogonal to each other and there is a waveplate to rotate the polarization of the coherent light transmitter or coherent light receiver.

9. The apparatus of claim 7 wherein the coherent light transmitter and coherent light receiver gratings are parallel to each other and there are waveguide bends connecting the gratings to the arrays of waveguides.

* * * * *